US008482676B2

(12) United States Patent
Hung (10) Patent No.: US 8,482,676 B2
(45) Date of Patent: Jul. 9, 2013

(54) DIFFERENTIAL ANTENNA AND ASSOCIATED CONTROL SYSTEM APPLIED TO DIGITAL TV

(75) Inventor: Guo-Ying Hung, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 98 days.

(21) Appl. No.: 13/047,324

(22) Filed: Mar. 14, 2011

(65) Prior Publication Data
US 2011/0221973 A1    Sep. 15, 2011

(30) Foreign Application Priority Data

Mar. 15, 2010   (TW) ............................... 99107482 A (51) Int. Cl.
*H04N 5/44* (2006.01)
*H01Q 5/01* (2006.01)

(52) U.S. Cl.
USPC .......................................... 348/725; 343/860

(58) Field of Classification Search
USPC .................. 348/725, 731, 732, 607; 343/893, 343/852, 853, 855, 860; 455/137, 138, 272, 455/273
See application file for complete search history.

(56) References Cited

U.S. PATENT DOCUMENTS

| 4,381,566 | A | | 4/1983 | Kane | |
|---|---|---|---|---|---|
| 5,943,012 | A | * | 8/1999 | Sinclair | 342/373 |
| 6,970,140 | B2 | * | 11/2005 | Hibino et al. | 343/860 |
| 7,936,311 | B2 | * | 5/2011 | Rowser et al. | 343/795 |
| 2004/0080466 | A1 | * | 4/2004 | Hibino et al. | 343/860 |
| 2005/0041152 | A1 | * | 2/2005 | Bendov | 348/570 |
| 2007/0241985 | A1 | * | 10/2007 | Suzuki et al. | 343/860 |
| 2008/0084356 | A1 | * | 4/2008 | Korner | 343/722 |
| 2008/0089452 | A1 | * | 4/2008 | Henderson et al. | 375/346 |
| 2010/0216419 | A1 | * | 8/2010 | Kanasaki et al. | 455/269 |
| 2011/0169712 | A1 | * | 7/2011 | Sumi et al. | 343/893 |

FOREIGN PATENT DOCUMENTS

| CN | 101267060 A | 9/2008 |
|---|---|---|
| DE | 20320731 | 1/2005 |
| EP | 0 428 229 | 11/1990 |
| JP | 2001-526483 | 12/2001 |
| JP | 2003198413 | 7/2003 |
| JP | 2008-177731 | 8/2008 |
| WO | WO 2009/053404 A1 | 4/2009 |

* cited by examiner

*Primary Examiner* — Victor Kostak
(74) *Attorney, Agent, or Firm* — Muncy, Geissler, Olds & Lowe, PLLC (57) ABSTRACT

A differential antenna and associated control system applied to a digital television (TV). The control system includes a differential antenna receiving a broadcasting signal and generating a differential radio frequency (RF) signal including a positive signal and a negative signal; a control unit generating a selecting signal according to a selected channel; a switch circuit including a switch control circuit and a plurality of matching circuits. Each of the matching circuits optimizes part of the digital TV bandwidth, and the switch control circuit receives the selecting signal to control that an optimized positive signal is generated to the control unit after the positive signal passes through a first matching circuit of the matching circuits, and an optimized negative signal is generated to the control unit after the negative signal passes through a second matching circuit of the matching circuits. The first matching circuit and the second matching circuit optimize the same frequency band, and a differential optimizing signal includes the optimized positive signal and the optimized negative signal. Thus, the control unit generates a selected channel signal accordingly.

14 Claims, 6 Drawing Sheets

DIFFERENTIAL ANTENNA AND ASSOCIATED CONTROL SYSTEM APPLIED TO DIGITAL TV

CROSS REFERENCE TO RELATED APPLICATIONS

This Non-provisional application claims priority under 35 U.S.C. §119(a) on Patent Application No(s). 099107482 filed in Taiwan, Republic of China on Mar. 15, 2010, the entire contents of which are hereby incorporated by reference.

BACKGROUND OF THE INVENTION

1. Field of Invention

The invention relates to an antenna and a control system thereof and, more particularly, to a differential antenna and a control system applied to a digital television (TV).

2. Related Art

Figure 1A:
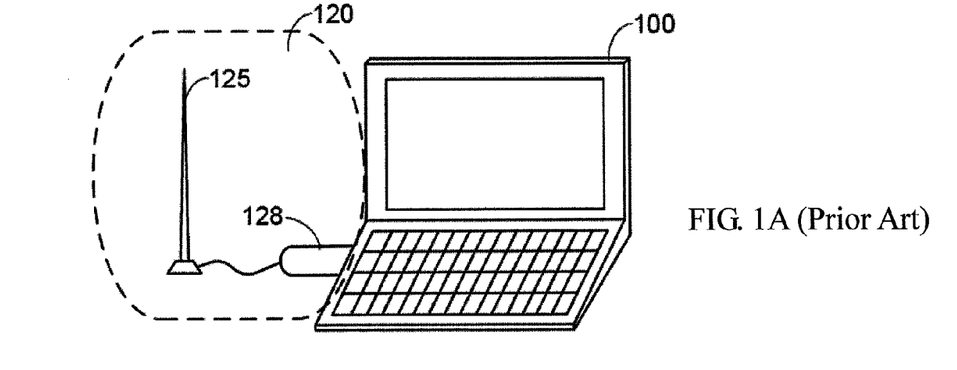
FIG. 1A is a schematic diagram showing a conventional digital TV receiving system applied to a host.

FIG. 1A is a schematic diagram showing a conventional digital TV receiver applied to a host. Generally, when a user watches a digital TV by using a host 100, he or she needs to connect a digital TV receiver 120 via a connector (such as a universal serial bus connector (USB) of the host 100, and application programs of the digital TV is installed in the host 100. The digital TV receiver 120 includes an antenna 125 and a control unit 128. The antenna 125 is used for receiving a broadcasting signal of the digital TV, and the control unit 128 further converts the broadcasting signal to a selected channel signal. The selected channel signal is the channel selected by the user and transmitted to the host 100.

Figure 1B:
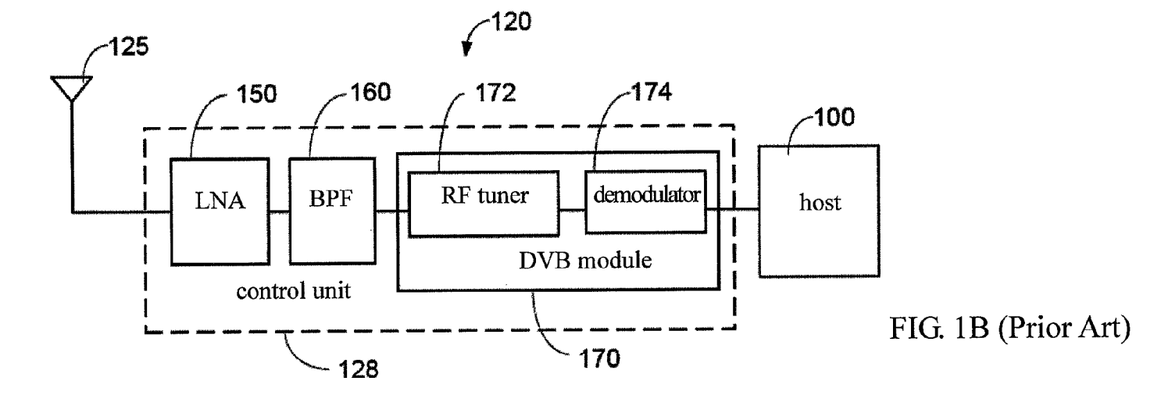
FIG. 1B is a block diagram showing a conventional digital TV receiver.

FIG. 1B is a block diagram showing a conventional digital TV receiver. The control unit 128 of the digital TV receiver 120 includes a low noise amplifier (LNA) 150, a band-pass filter (BPF) 160 and a digital video broadcast (DVB) module 170. The DVB module 170 further includes a radio frequency (RF) tuner 172 and a demodulator 174.

First, after the LNA 150 amplifies the RF signal, the BPF 160 keeps the digital TV bandwidth (about 450 MHz to 870 MHz) of the RF signal and transmits it to the DVB module 170. Second, the DVB module 170 retrieves the selected channel according to the user's instruction and outputs the selected channel signal to the host 100, and the host 100 shows the content of the channel on the screen. The RF tuner 172 processes the bandwidth of the selected channel to a base band signal according to the user's instruction, and the demodulator 174 demodulates the base band signal and converts it to the selected channel signal.

It is well-known that the digital TV system includes the DVB-T system in Europe, the advanced television system committee (ATSC) system in America, the integrated service digital broadcasting (ISDB-T) system in Japan and south America, the digital media broadcasting (DMB-T/H) system in China and so on. The digital TV bandwidth of the systems above is approximately between 460 MHz to 870 MHz. The bandwidth of the DVB-S satellite digital TV system is approximately between 950 MHz to 2150 MHz, and the bandwidth of the ISDB-S satellite digital TV system is approximately between 11.7 GHz to 12.2 GHz.

The length of the antenna is in inverse proportion to a receiving frequency, since the size of the antenna applied to the digital TV in market is large, the antenna cannot be disposed inside the host 100 which is relatively small.

Further, the electromagnetic interference (EMI) occurs in the host 100 in a conventional use, therefore, if the conventional antenna of the digital TV is disposed inside the host 100, the bad receiving signal due to EMI impact would lead to malfunction of the digital TV and cannot be watched.

SUMMARY OF THE INVENTION

A differential antenna of a digital TV and a control system thereof is provided. Different matching circuits are used to optimize different signals of the bandwidth, and thus the size of an antenna can be reduced greatly. The antenna may be disposed inside any electrical device of the digital TV, and a differential RF signal generated by the antenna resists the EMI of the electrical device effectively.

A control system of a digital TV is provided to receive a digital TV bandwidth which includes a differential antenna receiving a broadcasting signal and generating a differential RF signal including a positive signal and a negative signal; a control unit generating a selecting signal according to a selected channel; and a switch circuit including a plurality of matching circuits and a switch control circuit. Each of the matching circuits optimizes part of the digital TV bandwidth, the switch control circuit receives the selecting signal to control that an optimized positive signal is generated to the control unit after the positive signal passes through a first matching circuit of the matching circuits and an optimized negative signal is generated to the control unit after the negative signal passes through a second matching circuit of the matching circuits, the first matching circuit and the second matching circuit optimize the same bandwidth, the optimized positive signal and the optimized negative signal are a differential optimized signal, and the control unit receives the differential optimized signal and converts the differential optimized signal to a selected channel signal.

An antenna circuit of a digital TV is further provided for receiving a digital TV bandwidth which includes a differential antenna receiving a broadcasting signal and generating a differential RF signal. The differential RF signal includes a positive signal and a negative signal, and a switch circuit includes a plurality of matching circuits and a switch control circuit. Each of the matching circuits optimizes part of the digital TV bandwidth, the switch control circuit receives the selecting signal to control that an optimized positive signal is generated to the control unit after the positive signal passes through a first matching circuit of the matching circuits and an optimized negative signal is generated to the control unit after the negative signal passes through a second matching circuit of the matching circuits. The first matching circuit and the second matching circuit optimize the same bandwidth.

A control system of a digital TV is further provided for receiving a digital TV bandwidth which includes a differential antenna receiving a broadcasting signal and generating a differential RF signal; a front-end circuit receiving the differential RF signal and converting it to an amplified positive signal and an amplified negative signal; a control unit generating a selecting signal according to a selected channel; and a switch circuit including a plurality of matching circuits and a switch control circuit. Each of the matching circuits optimizes part of the digital TV bandwidth, the switch control circuit receives the selecting signal to control that an optimized positive signal is generated to the control unit after the positive signal passes through a first matching circuit of the matching circuits and an optimized negative signal is generated to the control unit after the negative signal passes through a second matching circuit of the matching circuits, the first matching circuit and the second matching circuit optimize the same bandwidth, the optimized positive signal and the optimized negative signal are a differential optimized signal, and the control unit receives the differential optimized signal and converts it to a selected channel signal.

An antenna circuit applied to a digital TV is further provided for receiving a digital TV bandwidth which includes a differential antenna receiving a broadcasting signal and generating a differential RF signal; a front-end circuit receiving the differential RF signal and converting it to an amplified positive signal and an amplified negative signal; a switch circuit including a plurality of matching circuits and a switch control circuit. Each of the matching circuits optimizes part of the digital TV bandwidth, the switch control circuit receives a selecting signal to control that an optimized positive signal is generated to the control unit after the positive signal passes through a first matching circuit of the matching circuits and an optimized negative signal is generated to the control unit after the negative signal passes through a second matching circuit of the matching circuits, the optimized positive signal and the optimized negative signal are a differential optimized signal, and the first matching circuit and the second matching circuit optimize the same bandwidth.

A control system of a digital TV is further provided for receiving a digital TV bandwidth which includes a differential antenna receiving a broadcasting signal and generating a differential RF signal; a front-end circuit receiving the differential RF signal and generating a single ended signal; a DVB module generating a selecting signal according to a selected channel; and a switch circuit including a plurality of matching circuits and a switch control circuit. Each of the matching circuits optimizes part of the digital TV bandwidth, and the switch control circuit receives the selecting signal to control that a single ended optimized signal is generated to the DVB module after the single ended signal passes through a first matching circuit of the matching circuits. The DVB module converts the single ended optimized signal to a selected channel signal.

An antenna circuit of the digital TV is further provided for receiving a digital TV bandwidth which includes a differential antenna receiving a broadcasting signal and generating a differential RF signal; a front-end circuit receiving the differential RF signal and converting a single ended signal; and a switch circuit including a plurality of the matching circuits and a switch control circuit. Each of the matching circuits optimizes part of the digital TV bandwidth, and the switch control circuit receives a selecting signal to control that a single ended optimized signal is generated after the single ended signal passes through a first matching circuit of the matching circuits.

These and other features, aspects and advantages of the present invention will become better understood with regard to the following description, appended claims, and accompanying drawings.

DETAILED DESCRIPTION OF THE INVENTION

Figure 2:
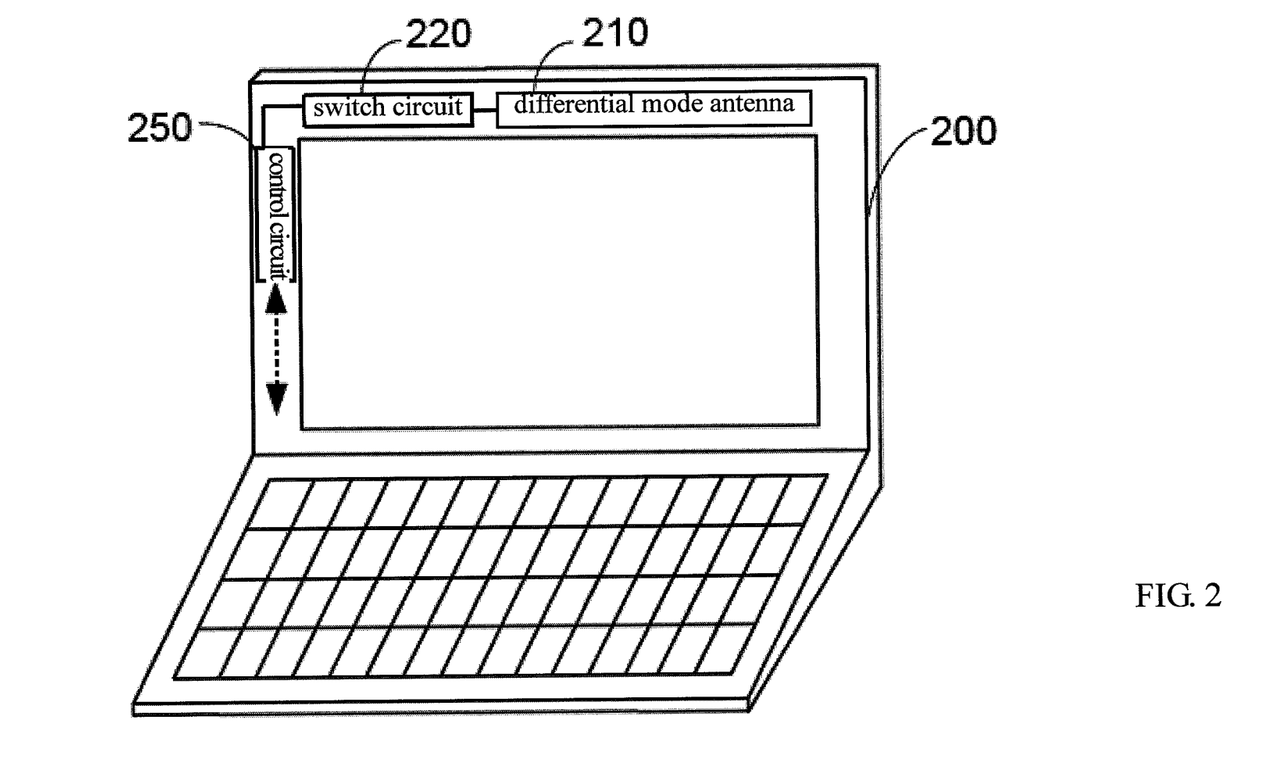
FIG. 2 is a schematic diagram showing a digital TV receiving system in an embodiment of the invention.

FIG. 2 is a schematic diagram showing a digital TV receiving system in an embodiment of the invention. The digital TV receiving system is disposed at an available area at the edge of the screen of a host 200, which is not limited herein. The digital TV receiving system may be also disposed in any electrical device such as a digital TV set-top box (STB), a satellite digital TV receiver, a car audio and a video receiver, or a TV which can receive the digital TV signal.

In FIG. 2, the digital TV receiving system includes a differential antenna 210, a switch circuit 220, and a control unit 250. The differential antenna 210 is used for receiving a broadcasting signal and generating a differential RF signal, and the switch circuit 220 is connected between the differential antenna 210 and the control unit 250. The switch circuit 220 optimizes a specific bandwidth corresponding to a selected channel of the differential RF signal. Afterwards, a differential optimized signal is outputted. The control unit 250 converts the differential optimized signal to a selected channel signal selected by the user and transmits the selected channel signal to an internal circuit of the host 200. Thus, the host 200 displays the content of the selected channel on the screen.

Generally speaking, the common mode noise of the EMI in the host 200 or other electrical devices is strong. The differential antenna 210 is used to restrain the common mode noise effectively according to an embodiment of the invention. Furthermore, to reduce the size of the differential antenna 210, the switch circuit 220 is used to optimize the bandwidth corresponding to the channel selected by the user and output the differential optimized signal to the control unit 250. Consequently, the size of the differential antenna 210 can be reduced to be smaller than 10 cm, and it is easy to dispose the differential antenna 210 at the available area at the edge of the screen.

Figure 3:
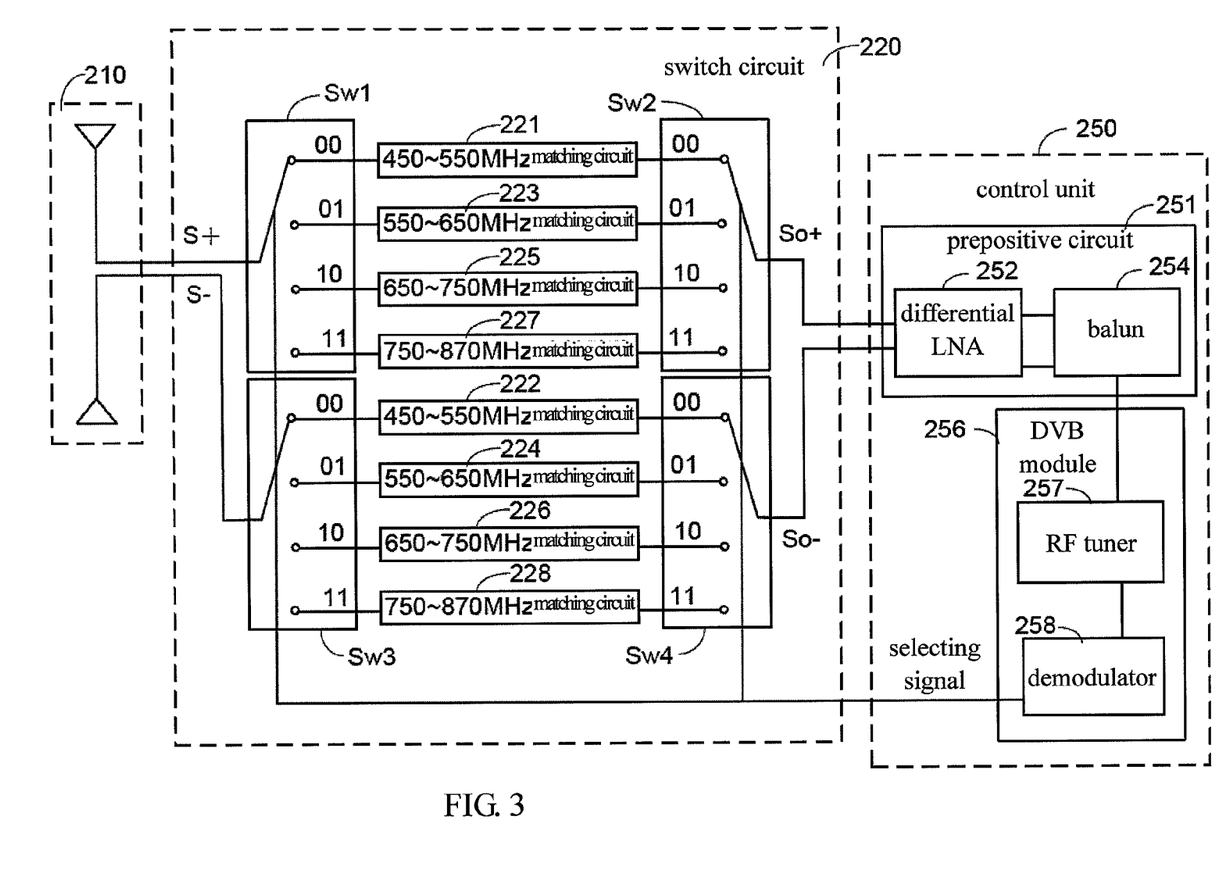
FIG. 3 is a block diagram showing a digital TV receiver in a first embodiment of the invention.

FIG. 3 is a block diagram showing a digital TV receiver in a first embodiment of the invention. The differential antenna 210 uses a dipole antenna. Except for the dipole antenna, a loop antenna may also be used as the differential antenna 210. The differential RF signal outputted by the differential antenna 210 includes a positive signal S+ and a negative signal S−.

The switch circuit 220 includes a switch control circuit including multiple switches Sw1 to Sw4 and a plurality of matching circuits 221 to 228, and the control unit 250 may output a 2-bit selecting signal to the switches Sw1 to Sw4 of the switch circuit 220. The matching circuits 221 to 228 optimize the different bandwidths of the digital TV bandwidth, and improve the receiving efficiency of the bandwidth.

For example, when the selecting signal is "00", the first switch Sw1 inputs the positive signal S+ to the 450-550 MHz matching circuit 221 which optimizes the signal with the 450 MHz to 550 MHz bandwidth in the positive signal S+, and the optimized positive signal So+ is outputted by the second switch Sw2; when the selecting signal is "01", the first switch Sw1 inputs the positive signal S+ to the 550-650 MHz matching circuit 223 which optimizes the signal with the 550 MHz to 650 MHz bandwidth in the positive signal S+, and the optimized positive signal So+ is outputted by the second switch Sw2; when the selecting signal is "10", the first switch Sw1 inputs the positive signal S+ to the 650-750 MHz matching circuit 225 which optimizes the signal with the 650 MHz to 750 MHz bandwidth in the positive signal S+, and the optimized positive signal So+ is outputted by the second switch Sw2; when the selecting signal is "11", the first switch Sw1 inputs the positive signal S+ to the 750-870 MHz matching circuit 227 which optimizes the signal with the 750 MHz to 870 MHz bandwidth in the positive signal S+, and the optimized positive signal So+ is outputted by the second switch Sw2. The principle of the actions to the negative signal S− by the third switch Sw3, the fourth switch Sw4, and the matching circuits 222, 224, 226, 228 are the same as the above principle, which is omitted herein. The optimized positive signal So+ and the optimized negative signal so− are the differential optimized signal.

The control unit 250 includes a prepositive circuit 251 and a DVB module 256. The prepositive circuit 251 includes a differential LNA 252 and a balun 254. The DVB module 256 further includes a RF tuner 257 and a demodulator 258.

The differential LNA 252 of the prepositive circuit 251 receives and amplifies the differential optimized signal. Afterwards, the balun 254 converts the differential optimized signal to a single ended optimized signal and inputs the single ended optimized signal to the DVB module 256. The DVB module 256 outputs the selecting signal according to the user's instruction, retrieves the selected channel from the single ended optimized signal and converts it to the selected channel signal to output to the host (or the electrical device). The host (or the electrical device) displays video on the corresponding screen. Furthermore, the RF tuner 257 converts the single ended optimized signal to the base band signal according to the user's instruction. The demodulator 258 outputs the selecting signal according to the user's instruction, demodulates the base band signal and converts it to the selected channel signal.

After the user selects a channel in the host (or the electrical device), the selected channel is transmitted to the DVB module 256. The demodulator 258 of the DVB module 256 outputs the selecting signal to the switch circuit 220, and the DVB module 256 converts the received single ended optimized signal to the selected channel signal. For example, if the selected channel is between 650 MHz and 750 MHz, the demodulator 258 outputs the selecting signal "10" to the switches Sw1 to Sw4. Similarly, the optimized positive signal So+ is generated after the positive signal S+ passes through the 650-750 MHz matching circuit 225, and the optimized negative signal so− is also generated after the negative signal S− passes through the 650-750 MHz matching circuit 226. After the control unit 250 receives the differential optimized signal, the single ended optimized signal is inputted into the DVB module 256 after it passes through the differential LNA 252 and the balun 254. The DVB module 256 outputs the selected channel signal to the host (or the electrical device), and the video is displayed on the corresponding screen.

Figure 4A:
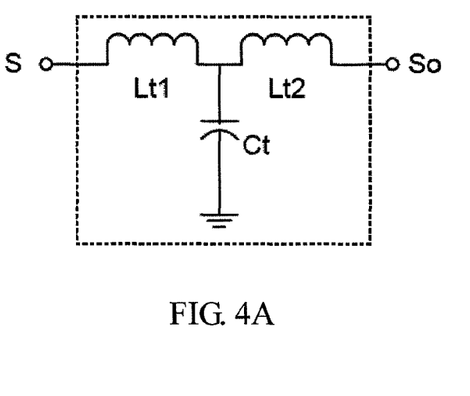
FIG. 4A to FIG. 4D are schematic diagrams showing matching circuits in different embodiments.
Figure 4B:
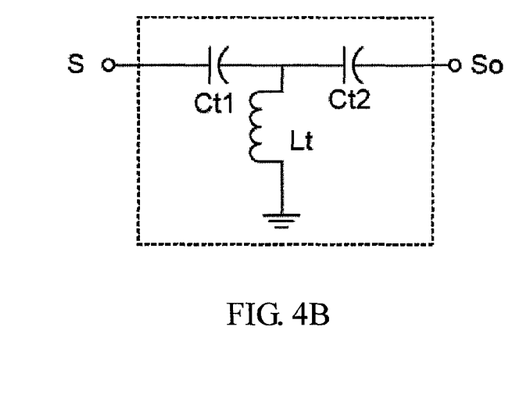
Figure 4C:
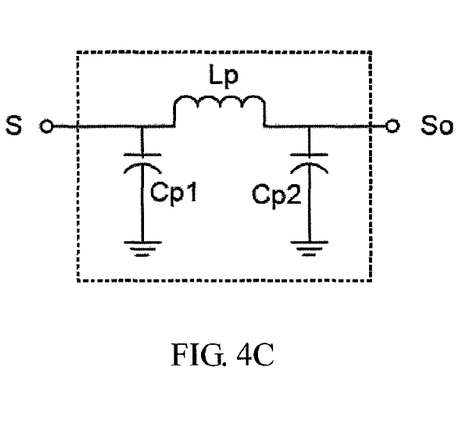
Figure 4D:
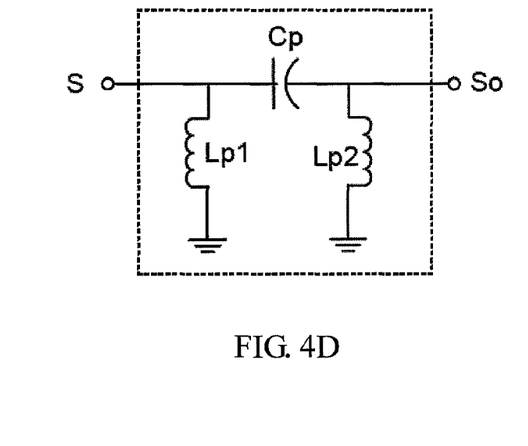

As shown in FIG. 4A to FIG. 4D, the matching circuits may be a T-shaped circuit or a π-shaped circuit. In FIG. 4A, the T-shaped circuit includes two inductors Lt1 and Lt2 connected in series between the input end S and the output end So. A capacitor Ct is connected between a connector point of the two inductors Lt1, Lt2 and a ground. In FIG. 4B, the T-shaped circuit includes two capacitors Ct1 and Ct2 connected in series between the input end S and the output end So. An inductor Lt is connected between the connector point of the two capacitors Ct1, Ct2 and the ground. In FIG. 4C, the π-shaped circuit includes an inductor Lp connected between the input end S and the output end So, a capacitor Cp1 connected between the input end S and the ground, and a capacitor Cp2 connected between the output end So and the ground. In FIG. 4D, the π-shaped circuit includes a capacitor Cp connected between the input end S and the output end so, an inductor Lp1 connected between the input end S and the ground, and an inductor Lp2 connected between the output end so and the ground. The matching circuits with different bandwidths can be obtained by adjusting the value of the inductor and the capacitor of the T-shaped circuit or the π-shaped circuit.

As stated above, the switch circuit is used to optimize the signal with different bandwidths to reduce the size of the differential antenna. Persons having ordinary skill in the art may make various modifications and changes according to the switch circuit in the embodiment. For example, in FIG. 3, a common mode filter may be added between the input end of the switch circuit 220 and the output end of the differential LNA 252 to filter the common mode noise completely.

Figure 5:
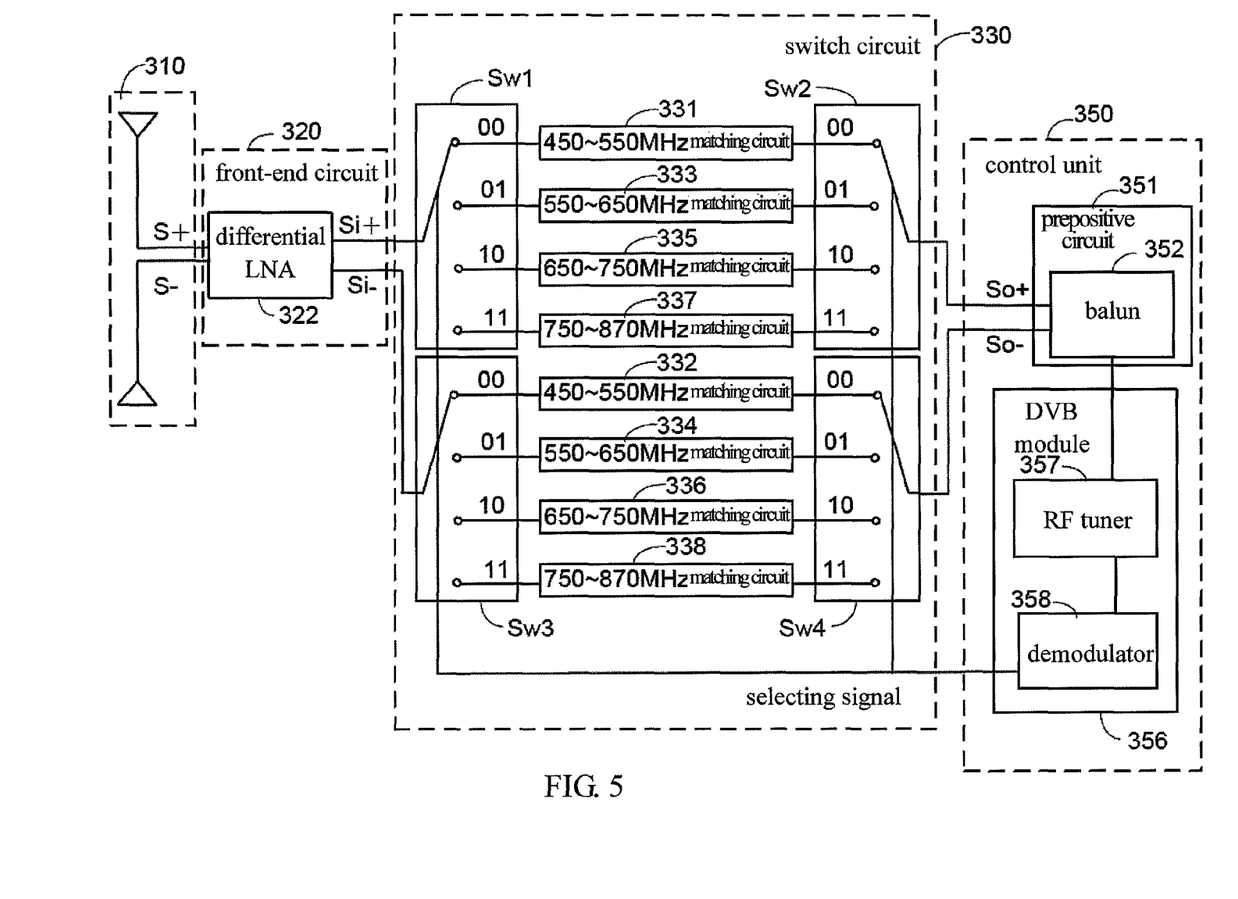
FIG. 5 is a block diagram showing a digital TV receiver in a second embodiment of the invention.

FIG. 5 is a block diagram showing a digital TV receiver in a second embodiment of the invention. The digital TV receiver includes a differential antenna 310, a front-end circuit 320, a switch circuit 330, and a control unit 350. The front-end circuit 320 is a differential LNA 322.

According to the second embodiment of the invention, the differential antenna 310 receives the broadcasting signal and outputs the differential RF signal which includes a positive signal S+ and a negative signal S−. The differential LNA 322 receives the differential RF signal and converts it to an amplified differential RF signal which includes an amplified positive signal Si+ and an amplified negative signal Si−.

The switch circuit 330 includes the switch control circuit including multiple switches Sw1 to Sw4 and a plurality of the matching circuits 331 to 338. The control unit 350 outputs a 2-bit selecting signal to the switches Sw1 to Sw4 of the switch circuit 330. The matching circuits 331 to 338 optimize the different bandwidths of the digital TV the bandwidth, and improve the receiving efficiency of the bandwidth.

For example, when the selecting signal is "00", the first switch Sw1 inputs the amplified positive signal Si+ to the 450-550 MHz matching circuit 331 which optimizes the signal with the 450 MHz to 550 MHz bandwidth in the amplified positive signal Si+, and then the optimized positive signal So+ is generated and outputted by the second switches Sw2; when the selecting signal is "01", the first switch Sw1 inputs the amplified positive signal Si+ to the 550-650 MHz matching circuit 333 which optimizes the signal with the 550 MHz to 650 MHz bandwidth in the amplified positive signal Si+, and then the optimized positive signal So+ is generated and outputted by the second switches Sw2; when the selecting signal is "10", the first switch Sw1 inputs the amplified positive signal Si+ to the 650-750 MHz matching circuit 335 which optimizes the signal with the 650 MHz to 750 MHz bandwidth in the amplified positive signal Si+, and then the optimized positive signal So+ is generated and outputted by the second switches Sw2; when the selecting signal is "11", the first switch Sw1 inputs the amplified positive signal Si+ to the 750-870 MHz matching circuit 337 which optimizes the signal with the 750 MHz to 870 MHz bandwidth in the amplified positive signal Si+, and then the optimized positive signal So+ is generated and outputted by the second switches Sw2. The principle of actions to the amplified negative signal Si− by the third switch Sw3, the fourth switch Sw4, and the matching circuits 332, 334, 336, 338 are the same as the above principle, which is omitted herein. The optimized positive signal So+ and the optimized negative signal so− are the differential optimized signal.

The control unit 350 includes a prepositive circuit 351 and a DVB module 356. The prepositive circuit 351 is a balun, and the DVB module 356 includes a RF tuner 357 and a demodulator 358.

The balun 352 converts the differential optimized signal to the single ended optimized signal and inputs it to the DVB module 356. The DVB module 356 outputs the selecting signal according to the user's instruction, retrieves the selected channel from the single ended optimized signal and converts it to the selected channel signal to the host (or the electrical device). The host (or the electrical device) displays video signal on the corresponding screen. The RF tuner 357 converts the single ended optimized signal to the base band signal according to the user's instruction. The demodulator 358 outputs the selecting signal according to the user's instruction, demodulates the base band signal and converts it to the selected channel signal.

After the user determines a selected channel at the host (or the electrical device), the selected channel is transmitted to the DVB module 356. The demodulator 358 of the DVB module 356 outputs the selecting signal to the switch circuit 330, and the DVB module 356 converts the received single ended optimized signal to the selected channel signal. For example, if the selected channel is in 650 MHz to 750 MHz, the demodulator 358 outputs the "10" selecting signal to the switches Sw1 to Sw4. Thus, after the amplified positive signal Si+ passes through the 650-750 MHz matching circuit 335, the optimized positive signal So+ is generated Similarly, after the amplified negative signal Si− passes through the 650-750 MHz matching circuit 336, the optimized negative signal So− is generated after the control unit 350 receives the differential optimized signal, the single ended optimized signal is inputted to the DVB module 356 after it passes through the balun 352. Then, the DVB module 356 outputs the selected channel signal to the host (or the electrical device), and the video is displayed on the corresponding screen.

Persons having ordinary skill in the art may further add a common mode filter to the front-end circuit 320 or the prepositive circuit 351 of the digital TV receiver in the second embodiment to filter the common mode noise completely.

Figure 6:
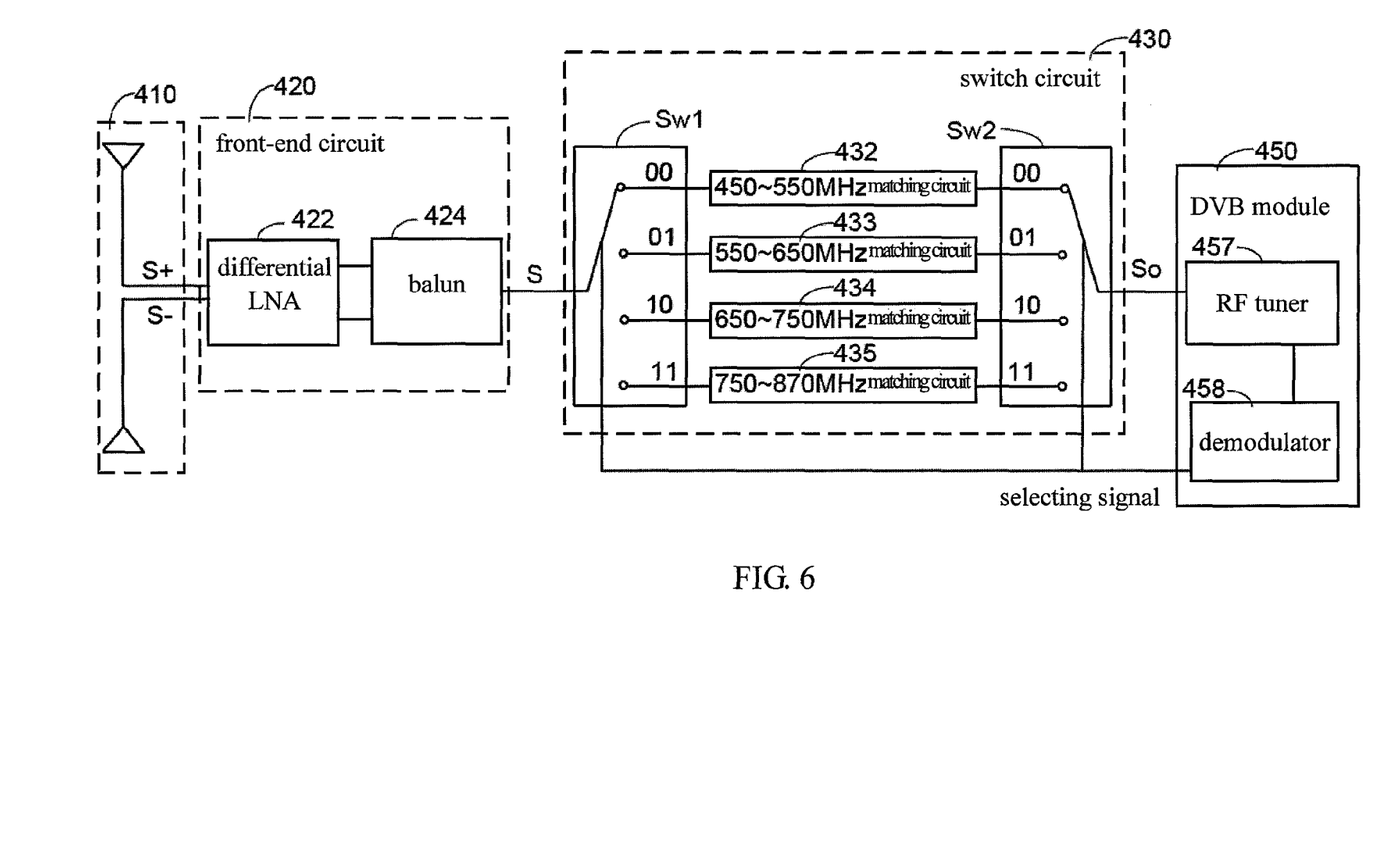
FIG. 6 is a block diagram showing a digital TV receiver in a third embodiment of the invention.

FIG. 6 is a block diagram showing a digital TV receiver in a third embodiment of the invention. The digital TV receiver includes a differential antenna 410, a front-end circuit 420, a switch circuit 430, and a DVB module 450. The differential antenna 410 receives the broadcasting signal and converts it to the differential RF signal which includes a positive signal S+ and a negative signal S−.

The front-end circuit 420 receives the differential RF signal and converts it to a single ended signal. The front-end circuit 420 further includes a differential LNA 422 and a balun 424. The differential LNA 422 receives and amplifies the differential RF signal. Afterwards, the balun 424 converts the amplified differential RF signal to the single ended signal S.

The switch circuit 430 includes the switch control circuit including multiple switches Sw1 to Sw2 and a plurality of the matching circuits 432 to 435, and the DVB module 450 may output the 2-bit selecting signal to the switches Sw1 to Sw2 of the switch circuit 430. The matching circuits 432 to 435 optimize the digital TV bandwidth with different bandwidths, and improve the receiving efficiency of the bandwidth.

For example, when the selecting signal is "00", the first switches Sw1 inputs the single ended signal S to the 450-550 MHz matching circuit 432 which optimizes the signal with the 450 MHz to 550 MHz bandwidth in the single ended signal S, and the single ended optimized signal So is outputted by the second switches Sw2; when the selecting signal is "01", the first switches Sw1 inputs the single ended signal S to the 550-650 MHz matching circuit 433 which optimizes the signal with the 550 MHz to 650 MHz bandwidth in the single ended signal S, and the single ended optimized signal So is outputted by the second switches Sw2; when the selecting signal is "10", the first switches Sw1 inputs the single ended signal S to the 650-750 MHz matching circuit 434 which optimizes the signal with the 650 MHz to 750 MHz bandwidth in the single ended signal S, and the single ended optimized signal So is outputted by the second switches Sw2; when the selecting signal is "11", the first switches Sw1 inputs the single ended signal S to the 750-870 MHz matching circuit 435 which optimizes the signal with the 750 MHz to 870 MHz bandwidth in the single ended signal S, and the single ended optimized signal So is outputted by the second switches Sw2.

The DVB module 450 outputs the selecting signal according to the user's instruction, retrieves the selected channel selected by the user from the single ended optimized signal and converts it to the selected channel signal to the host (or the electrical device). The host (or the electrical device) displays the content of the channel signal on the corresponding screen. The DVB module 450 further includes a RF tuner 457 and a demodulator 458. The RF tuner 457 converts the single ended optimized signal to the base band signal according to the user's instruction. The demodulator 458 outputs the selecting signal according to the user's instruction, demodulates the base band signal and converts it to the selected channel signal.

When the user determines a selected channel at the host (or the electrical device), the selected channel is transmitted to the DVB module 450. The demodulator 458 of the DVB module 450 outputs the selecting signal to the switch circuit 430, and the DVB module 450 converts the received single ended optimized signal to the selected channel signal. For example, if the selected channel is between 650 MHz to 750 MHz, the demodulator 458 outputs the "10" selecting signal to the switches Sw1 to Sw2. Thus, the single ended optimized signal So is generated after the single ended signal S passes through the 650-750 MHz matching circuit 434. The DVB module 450 receives the single ended optimized signal So, and then it can output the selected channel signal to the host (or the electrical device), and the content of the selected channel is displayed on the corresponding screen.

Besides, the number of the matching circuits is not limited herein. Persons having ordinary skill in the art may design the matching circuits with different bandwidths, and match with the switch control circuit including different switches to achieve the switch circuit in the embodiment. Moreover, although the antenna and the digital TV receiver take the digital TV bandwidth 450 MHz to 870 MHz as an example, they may also be applied to a DVB-S satellite digital TV system or an ISDB-S satellite digital TV system.

Persons having ordinary skill in the art may change the front-end circuit, for example, they may exchange the positions of the differential LNA 422 and the balun 424 of the front-end circuit 420 in the third embodiment, or convert the differential RF signal to the single ended signal.

Although the antenna circuit of the digital TV and the receiving system are disposed in the host (or the electrical device), the digital TV receiving system is not limited to be disposed in the host (or the electrical device). Persons having ordinary skill in the art also may dispose the receiving system outside the host (or the electrical device) to achieve the same effect.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A control system of a digital television (TV) receiving a digital TV bandwidth, comprising:
   a differential antenna receiving broadcasting signal and generating a differential radio frequency (RF) signal including a positive signal and a negative signal;
   a control unit generating a selecting signal according to a selected channel; and
   a switch circuit including a plurality of matching circuits and a switch control circuit,
   wherein each of the matching circuits optimizes part of the digital TV bandwidth, the switch control circuit receives the selecting signal to control that an optimized positive signal is generated to the control unit after the positive signal passes through a first matching circuit of the matching circuits and an optimized negative signal is generated to the control unit after the negative signal passes through a second matching circuit of the matching circuits, the first matching circuit and the second matching circuit optimize the same bandwidth, the optimized positive signal and the optimized negative signal are a differential optimized signal, and the control unit receives the differential optimized signal and converts the differential optimized signal to a selected channel signal.

2. The control system according to claim 1, wherein the differential antenna is a dipole antenna or a loop antenna.

3. The control system according to claim 1, wherein the control unit comprises:
   a prepositive circuit receiving the differential optimized signal and generating a single ended optimized signal; and
   a digital video broadcast (DVB) module converting the single ended optimized signal to the selected channel signal according to the selected channel.

4. The control system according to claim 3, wherein the prepositive circuit comprises:
   a differential low noise amplifier (LNA) receiving and amplifying the differential optimized signal; and
   a balun converting the amplified differential optimized signal to the single ended optimized signal.

5. The control system according to claim 3, wherein the DVB module comprises:
   a radio frequency (RF) tuner converting a bandwidth of the selected channel in the single ended optimized signal to a base band signal according to the selected channel; and
   a demodulator outputting the selecting signal according to the selected channel and converting the base band signal to the selected channel signal.

6. The control system according to claim 3, wherein the prepositive circuit comprises a balun converting the amplified differential optimized signal to the single ended optimized signal.

7. The control system according to claim 1, wherein the control unit is further connected to an electrical device, and the electrical device provides the selected channel to the control unit and receives the selected channel signal.

8. The control system according to claim 7, wherein the electrical device is a host, a digital TV set-top box, a satellite digital TV receiver, a car audio and video receiver, or a TV which receives the digital TV signal.

9. The control system according to claim 1, wherein each of the matching circuits is a T-shaped circuit or a n-shaped circuit including capacitors and inductors.

10. The control system according to claim 1, further comprising a differential LNA connected between the differential antenna and the switch circuit and used for receiving and amplifying the differential RF signal.

11. An antenna circuit applied to a digital TV receiving a digital TV bandwidth, comprising:
    a differential antenna receiving a broadcasting signal and generating a differential RF signal including a positive signal and a negative signal; and
    a switch circuit including a plurality of matching circuits and a switch control circuit,
    wherein each of the matching circuits optimizes part of the digital TV bandwidth, the switch control circuit receives a selecting signal to control that an optimized positive signal is generated after the positive signal passes through a first matching circuit of the matching circuits and an optimized negative signal is generated after the negative signal passes through a second matching circuit of the matching circuits, and the first matching circuit and the second matching circuit optimize the same bandwidth.

12. The antenna circuit according to claim 11, wherein the differential antenna is a dipole antenna or a loop antenna.

13. The antenna circuit according to claim 11, wherein each of the matching circuits is a T-shaped circuit or a n-shaped circuit including capacitors and inductors.

14. The antenna circuit according to claim 11, further comprising a differential LNA connected between the differential antenna and the switch circuit and used for receiving and amplifying the differential RF signal.

* * * * *